(12) United States Patent
Marchais et al.

(10) Patent No.: US 11,736,093 B2
(45) Date of Patent: *Aug. 22, 2023

(54) IDENTIFYING MECHANICAL IMPEDANCE OF AN ELECTROMAGNETIC LOAD USING LEAST-MEAN-SQUARES FILTER

(71) Applicant: Cirrus Logic International Semiconductor Ltd., Edinburgh (GB)

(72) Inventors: Emmanuel Marchais, Austin, TX (US); Pablo Peso Parada, Maidenhead (GB); Eric Lindemann, Boulder, CO (US)

(73) Assignee: Cirrus Logic Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,011

(22) Filed: Oct. 6, 2022

(65) Prior Publication Data

US 2023/0030780 A1 Feb. 2, 2023

Related U.S. Application Data

(63) Continuation of application No. 16/559,238, filed on Sep. 3, 2019, now Pat. No. 11,509,292.

(Continued)

(51) Int. Cl.
*G06K 9/00* (2022.01)
*H03H 17/06* (2006.01)
(Continued)

(52) U.S. Cl.
CPC ............ *H03H 17/06* (2013.01); *G01H 15/00* (2013.01); *G06F 3/016* (2013.01); *H02N 2/06* (2013.01); *H03H 7/12* (2013.01)

(58) Field of Classification Search
CPC .......... H03H 17/06; H03H 7/12; G01H 15/00; G06F 3/016; H02N 2/06
See application file for complete search history.

(56) References Cited

U.S. PATENT DOCUMENTS

| 3,686,927 A | 8/1972 | Scharton |
| 4,902,136 A | 2/1990 | Mueller et al. |

(Continued)

FOREIGN PATENT DOCUMENTS

| AU | 2002347829 | 4/2003 |
| CN | 103165328 A | 6/2013 |

(Continued)

OTHER PUBLICATIONS

International Search Report and Written Opinion of the International Searching Authority, International Application No. PCT/GB2019/050964, dated Sep. 3, 2019.

(Continued)

*Primary Examiner* — Dhaval V Patel
(74) *Attorney, Agent, or Firm* — Jackson Walker L.L.P

(57) ABSTRACT

A method for identifying a mechanical impedance of an electromagnetic load may include generating a waveform signal for driving an electromagnetic load and, during driving of the electromagnetic load by the waveform signal or a signal derived therefrom, receiving a current signal representative of a current associated with the electromagnetic load and a back electromotive force signal representative of a back electromotive force associated with the electromagnetic load. The method may also include implementing an adaptive filter to identify parameters of the mechanical impedance of the electromagnetic load, wherein an input of a coefficient control for adapting coefficients of the adaptive filter is a first signal derived from the back electromotive force signal and a target of the coefficient control for adapting coefficients of the adaptive filter is a second signal derived from the current signal.

26 Claims, 2 Drawing Sheets

Related U.S. Application Data

(60) Provisional application No. 62/826,299, filed on Mar. 29, 2019.

(51) Int. Cl.
*H03H 7/12* (2006.01)
*G06F 3/01* (2006.01)
*H02N 2/06* (2006.01)
*G01H 15/00* (2006.01)

(56) References Cited

U.S. PATENT DOCUMENTS

| | | |
|---|---|---|
| 5,374,896 A | 12/1994 | Sato et al. |
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,294,891 B1 | 9/2001 | McConnell et al. |
| 6,332,029 B1 | 12/2001 | Azima et al. |
| 6,388,520 B2 | 5/2002 | Wada et al. |
| 6,567,478 B2 | 5/2003 | Oishi et al. |
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,816,833 B1 | 11/2004 | Iwamoto et al. |
| 6,906,697 B2 | 6/2005 | Rosenberg |
| 6,995,747 B2 | 2/2006 | Casebolt et al. |
| 7,042,286 B2 | 5/2006 | Meade et al. |
| 7,154,470 B2 | 12/2006 | Tierling |
| 7,277,678 B2 | 10/2007 | Rozenblit et al. |
| 7,333,604 B2 | 2/2008 | Zernovizky et al. |
| 7,392,066 B2 | 6/2008 | Haparnas |
| 7,456,688 B2 | 11/2008 | Okazaki et al. |
| 7,623,114 B2 | 11/2009 | Rank |
| 7,639,232 B2 | 12/2009 | Grant et al. |
| 7,777,566 B1 | 8/2010 | Drogi et al. |
| 7,791,588 B2 | 9/2010 | Tierling et al. |
| 7,825,838 B1 | 11/2010 | Srinivas et al. |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,572,296 B2 | 10/2013 | Cruz-Hernandez et al. |
| 8,593,269 B2 | 11/2013 | Grant et al. |
| 8,648,659 B2 | 2/2014 | Oh et al. |
| 8,648,829 B2 | 2/2014 | Shahoian et al. |
| 8,659,208 B1 | 2/2014 | Rose et al. |
| 8,754,757 B1 | 6/2014 | Ullrich et al. |
| 8,754,758 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 * | 3/2015 | Gregorio .............. G06F 3/016 310/317 |
| 9,019,087 B2 | 4/2015 | Bakircioglu et al. |
| 9,030,428 B2 | 5/2015 | Fleming |
| 9,063,570 B2 | 6/2015 | Weddle et al. |
| 9,070,856 B1 | 6/2015 | Rose et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klippel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 * | 7/2017 | Sinclair .............. G06F 3/0488 |
| 9,740,381 B1 | 8/2017 | Chaudhri et al. |
| 9,842,476 B2 * | 12/2017 | Rihn .............. G06F 3/167 |
| 9,864,567 B2 | 1/2018 | Seo |
| 9,881,467 B2 | 1/2018 | Levesque |
| 9,886,829 B2 * | 2/2018 | Levesque .............. G08B 6/00 |
| 9,946,348 B2 | 4/2018 | Ullrich et al. |
| 9,947,186 B2 * | 4/2018 | Macours .............. G06F 3/016 |
| 9,959,744 B2 | 5/2018 | Koskan et al. |
| 9,965,092 B2 | 5/2018 | Smith |
| 10,032,550 B1 | 7/2018 | Zhang et al. |
| 10,039,080 B2 | 7/2018 | Miller et al. |
| 10,055,950 B2 | 8/2018 | Saboune et al. |
| 10,074,246 B2 | 9/2018 | Da Costa et al. |
| 10,102,722 B2 | 10/2018 | Levesque et al. |
| 10,110,152 B1 | 10/2018 | Hajati |
| 10,171,008 B2 | 1/2019 | Nishitani et al. |
| 10,175,763 B2 | 1/2019 | Shah |
| 10,191,579 B2 | 1/2019 | Forlines et al. |
| 10,264,348 B1 | 4/2019 | Harris et al. |
| 10,275,087 B1 | 4/2019 | Smith |
| 10,402,031 B2 | 9/2019 | Vandermeijden et al. |
| 10,564,727 B2 | 2/2020 | Billington et al. |
| 10,620,704 B2 | 4/2020 | Rand et al. |
| 10,667,051 B2 | 5/2020 | Stahl |
| 10,726,683 B1 | 7/2020 | Mondello et al. |
| 10,735,956 B2 | 8/2020 | Bae et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,841,696 B2 | 11/2020 | Mamou-Mani |
| 10,848,886 B2 | 11/2020 | Rand |
| 10,860,202 B2 | 12/2020 | Sepehr et al. |
| 10,955,955 B2 | 3/2021 | Peso Parada et al. |
| 10,969,871 B2 | 4/2021 | Rand et al. |
| 10,976,825 B2 | 4/2021 | Das et al. |
| 11,069,206 B2 | 7/2021 | Rao et al. |
| 11,079,874 B2 | 8/2021 | Lapointe et al. |
| 11,139,767 B2 | 10/2021 | Janko et al. |
| 11,150,733 B2 | 10/2021 | Das et al. |
| 11,259,121 B2 | 2/2022 | Lindemann et al. |
| 11,460,526 B1 | 10/2022 | Foo et al. |
| 11,500,469 B2 * | 11/2022 | Rao .............. G06F 3/016 |
| 2001/0043714 A1 | 11/2001 | Asada et al. |
| 2002/0018578 A1 | 2/2002 | Burton |
| 2002/0085647 A1 | 7/2002 | Oishi et al. |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2005/0195919 A1 | 9/2005 | Cova |
| 2006/0028095 A1 | 2/2006 | Maruyama et al. |
| 2006/0197753 A1 | 9/2006 | Hotelling |
| 2007/0013337 A1 | 1/2007 | Liu et al. |
| 2007/0024254 A1 | 2/2007 | Radecker et al. |
| 2007/0241816 A1 | 10/2007 | Okazaki et al. |
| 2008/0077367 A1 | 3/2008 | Odajima |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |

(56) References Cited

U.S. PATENT DOCUMENTS

| | | |
|---|---|---|
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0189867 A1 | 7/2009 | Krah et al. |
| 2009/0278819 A1 | 11/2009 | Goldenberg et al. |
| 2009/0313542 A1 | 12/2009 | Cruz-Hernandez et al. |
| 2010/0013761 A1 | 1/2010 | Birnbaum et al. |
| 2010/0080331 A1 | 4/2010 | Garudadri et al. |
| 2010/0085317 A1 | 4/2010 | Park et al. |
| 2010/0141408 A1 | 6/2010 | Doy et al. |
| 2010/0141606 A1 | 6/2010 | Bae et al. |
| 2010/0260371 A1 | 10/2010 | Afshar |
| 2010/0261526 A1 | 10/2010 | Anderson et al. |
| 2011/0056763 A1 | 3/2011 | Tanase et al. |
| 2011/0075835 A1 | 3/2011 | Hill |
| 2011/0077055 A1 | 3/2011 | Pakula et al. |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0105367 A1 | 5/2012 | Son et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2013/0307786 A1 | 11/2013 | Heubel |
| 2014/0035736 A1 | 2/2014 | Weddle et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0125467 A1 | 5/2014 | Da Costa et al. |
| 2014/0139327 A1 | 5/2014 | Bau et al. |
| 2014/0176415 A1 | 6/2014 | Buuck et al. |
| 2014/0205260 A1 | 7/2014 | Lacroix et al. |
| 2014/0222377 A1 | 8/2014 | Bitan et al. |
| 2014/0226068 A1 | 8/2014 | Lacroix et al. |
| 2014/0253303 A1 | 9/2014 | Levesque |
| 2014/0292501 A1 | 10/2014 | Lim et al. |
| 2014/0300454 A1 | 10/2014 | Lacroix et al. |
| 2014/0340209 A1 | 11/2014 | Lacroix et al. |
| 2014/0347176 A1 | 11/2014 | Modarres et al. |
| 2015/0049882 A1 | 2/2015 | Chiu et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0077324 A1 | 3/2015 | Birnbaum et al. |
| 2015/0084752 A1 | 3/2015 | Heubel et al. |
| 2015/0116205 A1 | 4/2015 | Westerman et al. |
| 2015/0130767 A1 | 5/2015 | Myers et al. |
| 2015/0204925 A1 | 7/2015 | Hernandez et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0264455 A1 | 9/2015 | Granoto et al. |
| 2015/0268768 A1 | 9/2015 | Woodhull et al. |
| 2015/0324116 A1 | 11/2015 | Marsden et al. |
| 2015/0325116 A1 | 11/2015 | Umminger, III |
| 2015/0339898 A1 | 11/2015 | Saboune et al. |
| 2015/0341714 A1 | 11/2015 | Ahn et al. |
| 2015/0356981 A1 | 12/2015 | Johnson et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0132118 A1 | 5/2016 | Park et al. |
| 2016/0162031 A1 | 6/2016 | Westerman et al. |
| 2016/0179203 A1 | 6/2016 | Modarres et al. |
| 2016/0187987 A1 | 6/2016 | Ullrich et al. |
| 2016/0239089 A1 | 8/2016 | Taninaka et al. |
| 2016/0246378 A1 | 8/2016 | Sampanes et al. |
| 2016/0277821 A1 | 9/2016 | Kunimoto |
| 2016/0291731 A1 | 10/2016 | Liu et al. |
| 2016/0305996 A1 | 10/2016 | Martens et al. |
| 2016/0328065 A1 | 11/2016 | Johnson et al. |
| 2016/0358605 A1 | 12/2016 | Ganong, III et al. |
| 2017/0031495 A1 | 2/2017 | Smith |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0097381 A1 | 4/2017 | Stephens et al. |
| 2017/0153760 A1 | 6/2017 | Chawda et al. |
| 2017/0168574 A1 | 6/2017 | Zhang |
| 2017/0168773 A1 | 6/2017 | Keller et al. |
| 2017/0169674 A1 | 6/2017 | Macours |
| 2017/0180863 A1 | 6/2017 | Biggs et al. |
| 2017/0220197 A1 | 8/2017 | Matsumoto et al. |
| 2017/0256145 A1 | 9/2017 | Macours et al. |
| 2017/0277350 A1 | 9/2017 | Wang et al. |
| 2017/0357440 A1 | 12/2017 | Tse |
| 2018/0021811 A1 | 1/2018 | Kutez et al. |
| 2018/0033946 A1 | 2/2018 | Kemppinen et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0194369 A1 | 7/2018 | Lisseman et al. |
| 2018/0196567 A1 | 7/2018 | Klein et al. |
| 2018/0224963 A1 | 8/2018 | Lee et al. |
| 2018/0227063 A1 | 8/2018 | Heubel et al. |
| 2018/0237033 A1 | 8/2018 | Hakeem et al. |
| 2018/0206282 A1 | 9/2018 | Singh |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0304310 A1 | 10/2018 | Long |
| 2018/0321056 A1 | 11/2018 | Yoo et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0035235 A1 | 1/2019 | Da Costa et al. |
| 2019/0227628 A1 | 1/2019 | Rand et al. |
| 2019/0044651 A1 | 2/2019 | Nakada |

(56) References Cited

U.S. PATENT DOCUMENTS

| | | |
|---|---|---|
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0253031 A1 | 8/2019 | Vellanki et al. |
| 2019/0294247 A1 | 9/2019 | Hu et al. |
| 2019/0295755 A1 | 9/2019 | Konradi et al. |
| 2019/0296674 A1 | 9/2019 | Janko et al. |
| 2019/0297418 A1 | 9/2019 | Stahl |
| 2019/0305851 A1 | 10/2019 | Vegas-Olmos et al. |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2019/0384898 A1 | 12/2019 | Chen et al. |
| 2020/0117506 A1 | 4/2020 | Chan |
| 2020/0139403 A1 | 5/2020 | Palit |
| 2020/0150767 A1 | 5/2020 | Karimi Eskandary et al. |
| 2020/0218352 A1 | 7/2020 | Macours et al. |
| 2020/0231085 A1 | 7/2020 | Kunii et al. |
| 2020/0306796 A1 | 10/2020 | Lindemann et al. |
| 2020/0313529 A1 | 10/2020 | Lindemann |
| 2020/0313654 A1 | 10/2020 | Marchais et al. |
| 2020/0314969 A1 | 10/2020 | Marchais et al. |
| 2020/0348249 A1 | 11/2020 | Marchais et al. |
| 2020/0403546 A1 | 12/2020 | Janko et al. |
| 2021/0108975 A1 | 4/2021 | Peso Parada et al. |
| 2021/0125469 A1 | 4/2021 | Alderson |
| 2021/0153562 A1 | 5/2021 | Fishwick et al. |
| 2021/0157436 A1 | 5/2021 | Peso Parada et al. |
| 2021/0174777 A1 | 6/2021 | Marchais et al. |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0365118 A1 | 11/2021 | Rajapurkar et al. |
| 2022/0026989 A1 | 1/2022 | Rao et al. |
| 2022/0328752 A1 | 10/2022 | Lesso et al. |
| 2022/0404398 A1 | 12/2022 | Reynaga et al. |
| 2022/0408181 A1 | 12/2022 | Hendrix et al. |

FOREIGN PATENT DOCUMENTS

| | | |
|---|---|---|
| CN | 104811838 A | 7/2015 |
| CN | 204903757 U | 12/2015 |
| CN | 105264551 A | 1/2016 |
| CN | 106438890 A | 2/2017 |
| CN | 103403796 A | 7/2017 |
| CN | 106950832 A | 7/2017 |
| CN | 107665051 A | 2/2018 |
| CN | 107835968 A | 3/2018 |
| CN | 210628147 U | 5/2020 |
| CN | 113268138 A | 8/2021 |
| CN | 114237414 A | 3/2022 |
| EP | 0784844 B1 | 6/2005 |
| EP | 2306269 A | 4/2011 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | 08149006 A | 6/1996 |
| JP | H10184782 A | 7/1998 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017034973 A1 | 3/2017 |
| WO | 2017113651 A1 | 7/2017 |
| WO | 2017113652 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/GB2019/050770, dated Jul. 5, 2019.
Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
International Search Report and Written Opinion of the International Searching Authority, International Application No. PCT/GB2019/052991, dated Mar. 17, 2020.
Communication Relating to the Results of the Partial International Search, and Provisional Opinion Accompanying the Partial Search Result, of the International Searching Authority, International Application No. PCT/GB2020/050822, dated Jul. 9, 2020.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/051035, dated Jul. 10, 2020.
International Search Report and Written Opinion of the International Searching Authority, International Application No. PCT/GB2020/050823, dated Jun. 30, 2020.
International Search Report and Written Opinion of the International Searching Authority, International Application No. PCT/GB2020/051037, dated Jul. 9, 2020.
International Search Report and Written Opinion of the International Searching Authority, International Application No. PCT/GB2020/050822, dated Aug. 31, 2020.
International Search Report and Written Opinion of the International Searching Authority, International Application No. PCT/GB2020/051438, dated Sep. 28, 2020.
First Examination Opinion Notice, State Intellectual Property Office of the People's Republic of China, Application No. 201880037435.X, dated Dec. 31, 2020.
International Search Report and Written Opinion of the International Searching Authority, International Application No. PCT/US2020/056610, dated Jan. 21, 2021.
Invitation to Pay Additional Fees, Partial International Search Report and Provisional Opinion of the International Searching Authority, International Application No. PCT/US2020/052537, dated Jan. 14, 2021.
International Search Report and Written Opinion of the International Searching Authority, International Application No. PCT/GB2020/052537, dated Mar. 9, 2021.

(56) References Cited

OTHER PUBLICATIONS

Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.
International Search Report and Written Opinion of the International Searching Authority, International Application No. PCT/US2021/021908, dated Jun. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
First Office Action, China National Intellectual Property Administration, Patent Application No. 2019800211287, dated Jul. 5, 2021.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Examination Report under Section 18(3), United Kingdom Intellectual Property Office, Application No. GB2018051.9, dated Nov. 5, 2021.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.
Final Notice of Preliminary Rejection, Korean Patent Office, Application No. 10-2019-7036236, dated Nov. 29, 2021.
Examination Report under Section 18(3), United Kingdom Intellectual Property Office, Application No. GB2018050.1, dated Dec. 22, 2021.
Second Office Action, National Intellectual Property Administration, PRC, Application No. 2019800208570, dated Jan. 19, 2022.
Examination Report under Section 18(3), UKIPO, Application No. GB2106247.6, dated Mar. 31, 2022.
Examination Report under Section 18(3), UKIPO, Application No. GB2113228.7, dated Feb. 10, 2023.
Examination Report under Section 18(3), UKIPO, Application No. GB2113154.5, dated Feb. 17, 2023.
First Office Action, China National Intellectual Property Administration, Application No. 2019107179621, dated Jan. 19, 2023.
Examination Report under Section 18(3), UKIPO, Application No. GB2112207.2, dated Nov. 7, 2022.
Examination Report, Intellectual Property India, Application No. 202117019138, dated Jan. 4, 2023.
Combined Search and Examination Report under Sections 17 and 18(3), UKIPO, Application No. GB2210174.5, dated Aug. 1, 2022.
Examination Report under Section 18(3), UKIPO, Application No. GB2112207.2, dated Aug. 18, 2022.
Examination Report under Section 18(3), UKIPO, Application No. GB2115048.7, dated Aug. 24, 2022.
International Search Report and Written Opinion of the International Searching Authority, International Application No. PCT/US2022/030541, dated Sep. 1, 2022.
Vanderborght, B. et al., Variable impedance actuators: A review; Robotics and Autonomous Systems 61, Aug. 6, 2013, pp. 1601-1614.
International Search Report and Written Opinion of the International Searching Authority, International Application No. PCT/US2022/033190, dated Sep. 8, 2022.
International Search Report and Written Opinion of the International Searching Authonty, International Application No. PCT/US2022/033230, dated Sep. 15, 2022.
Communication pursuant to Article 94(3) EPC, European Patent Application No. EP18727512.8, dated Sep. 26, 2022.
Examination Report under Section 18(3), UKIPO, Application No. GB2117488.3, dated Apr. 27, 2023.

* cited by examiner

IDENTIFYING MECHANICAL IMPEDANCE OF AN ELECTROMAGNETIC LOAD USING LEAST-MEAN-SQUARES FILTER

RELATED APPLICATION

The present disclosure is a continuation of U.S. Nonprovisional patent application Ser. No. 16/559,238, filed Sep. 3, 2019, which claims priority to U.S. Provisional Patent Application Ser. No. 62/826,299, filed Mar. 29, 2019, each of which is incorporated by reference herein in its entirety.

FIELD OF DISCLOSURE

The present disclosure relates in general to tracking and identifying a mechanical impedance of an electromagnetic load, for example, a haptic transducer.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin, and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a haptic transducer 103 based on the signal. Controller 101 may be triggered by a trigger to output to the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2\pi\sqrt{CM}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping of the device, the vibration resonance of the haptic transducer may vary from time to time.

FIG. 2 illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

In a system having an electromagnetic load such as an LRA, it may be desirable to determine the parameters that define an impedance of the electromagnetic load. Knowledge of such parameters may allow for optimization of playback of signals (e.g., playback of haptic waveforms) to the electromagnetic load. In addition, determination of electromagnetic load impedance may be valuable as it may allow for adapting of a playback signal to allow the playback signal to track changing parameters of the electromagnetic load.

An electromagnetic load such as an LRA may be characterized by its impedance $Z_{Lra}$ as seen as the sum of a coil impedance $Z_{coil}$ and a mechanical impedance $Z_{mech}$:

$$Z_{Lra} = Z_{coil} + Z_{mech} \quad (2)$$

Coil impedance $Z_{coil}$ may in turn comprise a direct current (DC) resistance Re in series with an inductance Le:

$$Z_{coil} = Re + sLe \quad (3)$$

Mechanical impedance $Z_{mech}$ may be defined by three parameters including a resistance at resonance $R_{ES}$, an angular resonant frequency $\omega_0$ (e.g., $\omega_0 = 2\pi f_0$), and a quality factor q. Or equivalently, mechanical impedance $Z_{mech}$ may be defined by three parameters including the resistance at resonance $R_{ES}$, a capacitance $C_{MES}$ representing an electrical capacitance representative of an equivalent moving mass M of the spring system of haptic transducer, and inductance $L_{CES}$ representative of a compliance C of the spring system. The relationship among these quantities may be given by the following equations, in which s is the Laplace transform variable:

$$Z_{mech} = R_{ES}\frac{\frac{1}{q\omega_0}s}{1 + \frac{1}{q\omega_0}s + \frac{1}{q\omega_0}s^2} \quad (4)$$

$$q = \frac{R_{ES}}{(Bl)^2}\left(\frac{M}{C}\right)^{\frac{1}{2}} = R_{ES}\left(\frac{C_{MES}}{L_{CES}}\right)^{\frac{1}{2}} \quad (5)$$

$$\omega_0 = \frac{1}{\sqrt{C_{MES}L_{CES}}} \quad (6)$$

Traditional approaches for driving an LRA at resonance rely on detecting a time difference between zero crossings of the LRA's back electromotive force (back-EMF) and the load current or voltage. Such difference may then be used to adjust a period of a signal driven to the LRA. One disadvantage of this approach is its sensitivity to noise because all of the noise power is essentially aliased by an effective sampling rate at approximately two times the resonance frequency. Such approach may also suffer from slow convergence if a loop filter is used to reduce sensitivity to noise, because as a rule of thumb, bandwidth of the loop filter should be one-tenth of the effective sampling rate (or less). Further, using such approaches and LRA may be tri-stated at zero crossing events in order to allow a reading of back-EMF, which may result in a loss of drive duty cycle (e.g., maximum power from a driving amplifier may not be delivered to the LRA).

Existing approaches to determining a complex impedance may include using broadband noise to excite a system having an electromagnetic load. For example, using existing approaches, a Fast Fourier Transform of current and voltage waveforms associated with the electromagnetic load may be performed to determine impedance.

SUMMARY

In accordance with the teachings of the present disclosure, the disadvantages and problems associated with identifying a mechanical impedance of an electromagnetic load may be reduced or eliminated.

In accordance with embodiments of the present disclosure, a system for identifying a mechanical impedance of an electromagnetic load may include a signal generator configured to generate a waveform signal for driving an electromagnetic load and mechanical impedance identity circuitry. The mechanical impedance identity circuitry may be configured to, during driving of the electromagnetic load by the waveform signal or a signal derived therefrom, receive a current signal representative of a current associated with the electromagnetic load and a back electromotive force signal representative of a back electromotive force associated with the electromagnetic load. The mechanical impedance identity circuitry may also be configured to implement an adaptive filter to identify parameters of the mechanical impedance of the electromagnetic load, wherein an input of a coefficient control for adapting coefficients of the adaptive filter is a first signal derived from the back electromotive force signal and a target of the coefficient control for adapting coefficients of the adaptive filter is a second signal derived from the current signal.

In accordance with these and other embodiments of the present disclosure, a method for identifying a mechanical impedance of an electromagnetic load may include generating a waveform signal for driving an electromagnetic load and, during driving of the electromagnetic load by the waveform signal or a signal derived therefrom, receiving a current signal representative of a current associated with the electromagnetic load and a back electromotive force signal representative of a back electromotive force associated with the electromagnetic load. The method may also include implementing an adaptive filter to identify parameters of the mechanical impedance of the electromagnetic load, wherein an input of a coefficient control for adapting coefficients of the adaptive filter is a first signal derived from the back electromotive force signal and a target of the coefficient control for adapting coefficients of the adaptive filter is a second signal derived from the current signal.

In accordance with these and other embodiments of the present disclosure, a host device may include an electromagnetic load and system for identifying a mechanical impedance of the electromagnetic load. The system for identifying a mechanical impedance of the electromagnetic load may include a signal generator configured to generate a waveform signal for driving an electromagnetic load and mechanical impedance identity circuitry. The mechanical impedance identity circuitry may be configured to, during driving of the electromagnetic load by the waveform signal or a signal derived therefrom, receive a current signal representative of a current associated with the electromagnetic load and a back electromotive force signal representative of a back electromotive force associated with the electromagnetic load. The mechanical impedance identity circuitry may also be configured to implement an adaptive filter to identify parameters of the mechanical impedance of the electromagnetic load, wherein an input of a coefficient control for adapting coefficients of the adaptive filter is a first signal derived from the back electromotive force signal and a target of the coefficient control for adapting coefficients of the adaptive filter is a second signal derived from the current signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
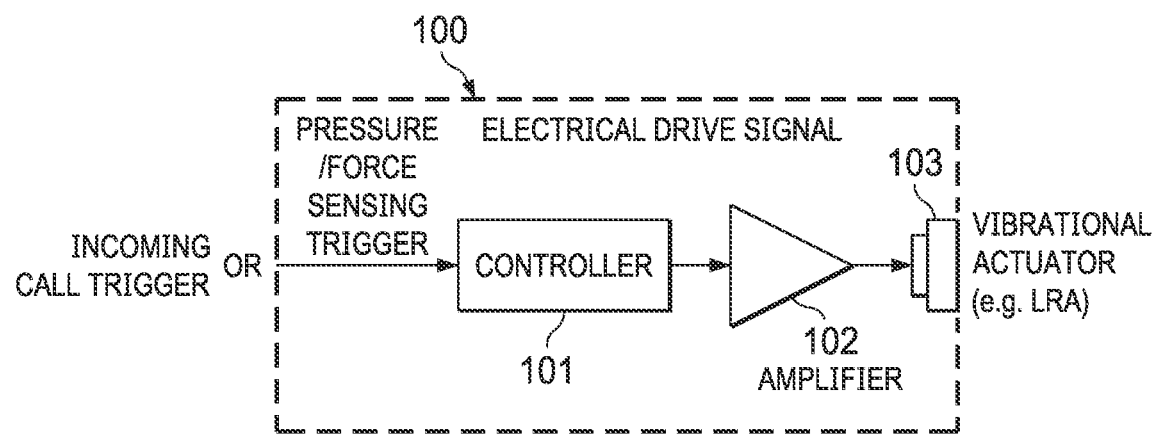
FIG. 1 illustrates an example of a vibro-haptic system in a device, as is known in the art.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively an electronic device may have a connector, e.g., a socket, for making a removable mating connection with a corresponding connector of an accessory apparatus and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

As previously mentioned, identifying a mechanical impedance of an electromagnetic load may be useful for some types of haptic application. In the present disclosure, and as described in greater detail below, a two-tone stimulus may be used to excite an electromagnetic load to provide four measurable parameters: an amplitude and phase of the electromagnetic load associated with each of the tones. Three of these four measureable parameters may then be chosen to determine the parameters (angular resonant frequency $\omega_0$, quality factor q, and resistance at resonance $R_{ES}$) of mechanical impedance $Z_{mech}$.

Figure 3:
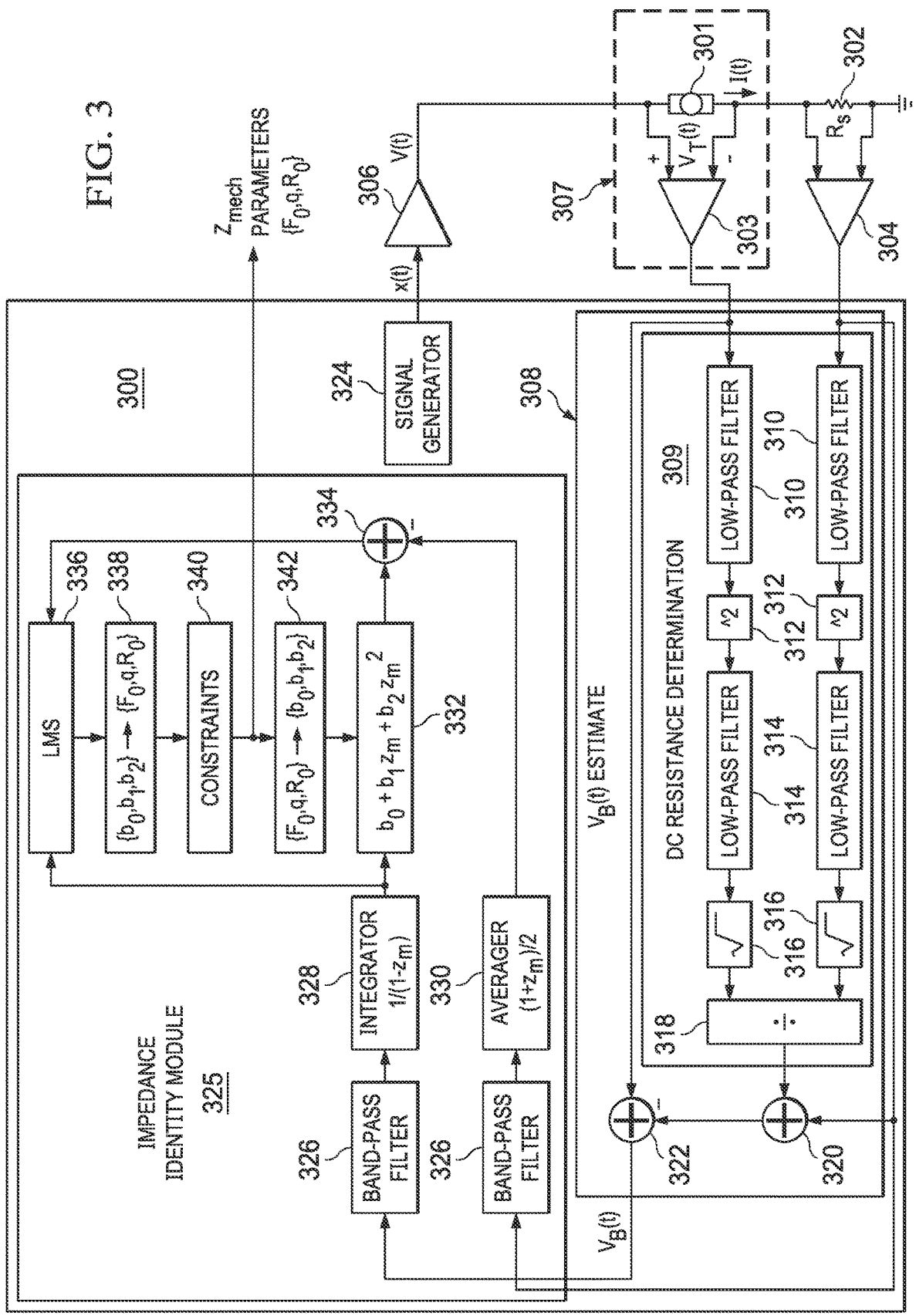
FIG. 3 illustrates an example system for identifying mechanical impedance of an electromagnetic load, in accordance with embodiments of the present disclosure.

FIG. 3 illustrates an example system 300 for identifying mechanical impedance of an electromagnetic load, in accordance with embodiments of the present disclosure. In some embodiments, system 300 may be integral to a host device comprising system 300 and haptic transducer 301. Such device may include, without limitation, a mobile device, home application, a vehicle, and/or any other system, device, or apparatus that includes a human-machine interface.

In operation, a signal generator 324 of system 300 may generate a waveform signal x(t). Waveform signal x(t) may in turn be amplified by amplifier 306 to generate the driving signal V(t) for driving haptic transducer 301. Although FIG. 3 depicts haptic transducer 301, in some embodiments, another electromagnetic load (e.g., a loudspeaker, a microspeaker, a piezoelectric transducer) may be present in lieu of haptic transducer 301.

Responsive to driving signal V(t), a sensed terminal voltage $V_T(t)$ of haptic transducer 301 may be converted to a digital representation by a first analog-to-digital converter (ADC) 303. Similarly, sensed current l(t) may be converted to a digital representation by a second ADC 304. Current l(t) may be sensed across a shunt resistor 302 having resistance $R_s$ coupled to a terminal of haptic transducer 301. The terminal voltage $V_T(t)$ may be sensed by a terminal voltage sensing block 307, for example a volt meter.

Figure 2:
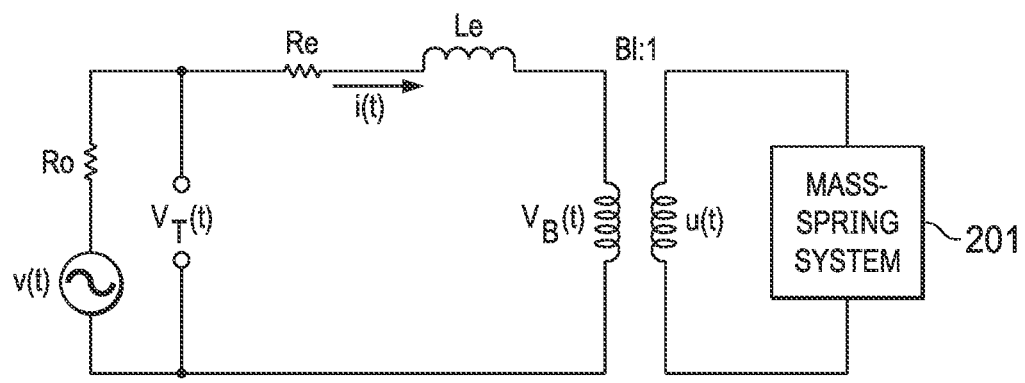
FIG. 2 illustrates an example of a Linear Resonant Actuator (LRA) modelled as a linear system, as is known in the art.

As shown in FIG. 3, system 300 may include a back-EMF estimate block 308 that may estimate back-EMF voltage $V_B(t)$. In general, back EMF voltage $V_B(t)$ may not be directly measured from outside of the haptic transducer. However, the terminal voltage $V_T(t)$ measured at the terminals of the haptic transducer may be related to $V_B(t)$ by:

$$V_T(t) = V_B(t) + Re \cdot I(t) + Le \cdot \frac{dI(t)}{dt} \quad (7)$$

where the parameters are defined as described with reference to FIG. 2. Consequently, back-EMF voltage $V_B(t)$ may be estimated according to equation (7) which may be rearranged as:

$$V_B(t) = V_T(t) - Re \cdot I(t) - Le \frac{dI(t)}{dt} \quad (8)$$

In some embodiments, back-EMF estimate block 308 may be implemented as a digital filter with a proportional and parallel difference path. The estimates of DC resistance Re and inductance Le may not need to be accurate (e.g., within an approximate 10% error may be acceptable), and thus, fixed values from an offline calibration or from a data sheet specification may be sufficient.

For example, a DC resistance determination block 309 may provide an estimate of the DC resistance Re and inductance Le, determined as a ratio (e.g., using divider 318) of the root-mean-square sensed terminal voltage $V_T(t)$ (using a squaring block 312 and a square root block 316) to the root-mean-square sensed current l(t) (using a squaring block 312 and a square root block 316) at frequencies below resonant frequency $f_0$, using one or more low-pass filters (e.g., filters 310 and 314) to filter out higher frequencies. Second filters 314 may be present to reduce alternating current (AC) components to avoid division by zero in calculations of DC resistance determination block 309. Accordingly, back-EMF voltage $V_B(t)$ may be estimated by calculating a voltage drop across a coil of haptic transducer 301 (e.g., calculated by multiplier 320) and subtracting such voltage drop from terminal voltage $V_T(t)$ (e.g., with combiner 322).

As shown in FIG. 3, system 300 may include an impedance identity module 325 configured to apply a least-mean-squares (LMS) adaptive filter (e.g., a three-tap finite impulse response filter 332 controlled by an LMS adaptive algorithm 336) to back-EMF voltage $V_B(t)$ and sensed current l(t) to determine the parameters (angular resonant frequency $\omega_0$, quality factor q, and resistance at resonance $R_{ES}$) of mechanical impedance $Z_{mech}$. Impedance identity module 325 may include band-pass filters 326 each configured to band-pass filter each of estimated back-EMF voltage $V_B(t)$ and sensed current l(t) around resonant frequency $f_0$.

A fixed integrator filter 328

$$\left(\text{e.g., with response } \frac{1}{1 - z_m}\right)$$

may filter the band-pass filtered estimated back-EMF voltage $V_B(t)$, which may serve as an input to an adaptive LMS algorithm 336. A fixed averaging filter 330

$$\left(\text{e.g., a moving average filter with response} \frac{1 + z_m}{2}\right)$$

may filter the band-pass filtered sensed current l(t), which may serve as a target to the adaptive LMS algorithm.

A three-tap adaptive finite impulse response filter 332 (e.g., with response $b_0 + b_1 z_m + b_2 z_m^2$) having coefficients $b_0$, $b_1$, and $b_2$ controlled by adaptive LMS algorithm 336 may filter the result of integrator 328. Combiner 334 may subtract the result of fixed averaging filter 330 from finite impulse response filter 332 to generate an error signal used to derive filter coefficient update by LMS algorithm 336.

LMS algorithm 336 may perform any suitable least-mean-squares approach to minimize the error signal generated by combiner 334, including without limitation a normalized LMS algorithm or a recursive least squares algorithm. In some embodiments, LMS algorithm 336 may normalize the update to help with filter convergence and thus may implement a normalized LMS algorithm.

A mapping block 338 may map filter coefficients $\{b_0, b_1, b_2\}$ into parameters $\{\omega_0, q, R_{ES}\}$ of mechanical impedance $Z_{mech}$. To illustrate such mapping, it is noted that when a current $I_{load}(t)$ passes through the mechanical impedance, the voltage across that mechanical impedance, the back-EMF voltage $V_B(t)$, may be given as $V_B(t)=Z_{mech}I_{load}(t)$. Using equation (4) above, such equation for back-EMF voltage $V_B(t)$ may be rewritten as:

$$I_{load} = V_B \frac{1}{s} \frac{q\omega_0}{R_0}\left(1 + \frac{1}{q\omega_0}s + \frac{1}{q\omega_0}s^2\right) \quad (9)$$

The continuous time system of Equation (9) may be mapped to an equivalent discrete-time system in which integrator response $$\frac{1}{s}$$

is mapped to the integrator 328 with response $$\frac{1}{1-z_m}$$

and the second-degree polynomial $$\frac{q\omega_0}{R_0}\left(1 + \frac{1}{q\omega_0}s + \frac{1}{q\omega_0}s^2\right)$$

is mapped to the polynomial $$(b_0 + b_1 z_m + b_2 z_m^2)\frac{2}{1+z_m}.$$

Thus, mapping block 338 can use bilinear transformation to map coefficients $\{b_0, b_1, b_2\}$ to parameters $\{\omega_0, q, R_{ES}\}$ of mechanical impedance $Z_{mech}$.

The foregoing explanation also demonstrates the various inputs to LMS algorithm 336, as using the mapping on Equation (9) and rewriting Equation (9) may result in:

$$\frac{2}{1+z_m}I_{load} = (b_0 + b_1 z_m + b_2 z_m^2)\frac{1}{1-z_m}V_B \quad (10)$$

Thus, as demonstrated in Equation (10), impedance identity module 325 may input the integrated back-EMF voltage $$\frac{1}{1-z_m}V_B$$

into adaptive filter 332, generate a two-cycle averaged load current $$\frac{2}{1+z_m}I_{load}$$

as the target of adaptive filter 332, and adaptive filter 332 defined by coefficients $\{b_0, b_1, b_2\}$ may be adapted by LMS algorithm 336 to model parameters $\{\omega_0, q, R_{ES}\}$ of mechanical impedance $Z_{mech}$.

A constraints block 340 may constrain parameters $\{\omega_0, q, R_{ES}\}$ of mechanical impedance $Z_{mech}$ within expected bounds to provide system 300's estimates of such parameters, which may in turn be estimated plant parameters for system 300. Another mapping block 342 may map constrained parameters $\{\omega_0, q, R_{ES}\}$ of mechanical impedance $Z_{mech}$ into filter coefficients $\{b_0, b_1, b_2\}$ for adaptive filter 332.

Accordingly, using system 300, total impedance of haptic transducer 301 may be modeled in discrete time as a third order infinite impulse response filter with a current input and voltage output. To prepare system 300 for LMS adaption, the model of the plant for the impedance may be split into two parts: (a) one that models the DC impedance (e.g., by DC resistance determination block 309) and (b) one that models mechanical admittance (e.g., by impedance identity module 325). Such LMS formulation of mechanical impedance may result in a low-cost approach for determining mechanical impedance, and may also yield a continuous update which may provide convenience in tracking changing load parameters.

While the foregoing contemplates the calculation of particular parameters of mechanical impedance $Z_{mech}$, namely resonant frequency $f_0$, quality factor q, and resistance at resonance $R_{ES}$, it is understood that systems and methods similar to that disclosed herein may be used to identify one or more other parameters for mechanical impedance $Z_{mech}$.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. Mechanical impedance identity circuitry comprising:
   a first input configured to receive a current signal representative of a current associated with an electromagnetic load during driving of the electromagnetic load by a waveform signal or a signal derived from the waveform signal; and
   a second input configured to receive a back electromotive force signal representative of a back electromotive force associated with the electromagnetic load during driving of the electromagnetic load by the waveform signal or the signal derived from the waveform signal; and
   an adaptive filter to identify parameters of the mechanical impedance of the electromagnetic load, wherein:
   an input of a coefficient control for adapting coefficients of the adaptive filter is a first signal derived from the back electromotive force signal; and
   a target of the coefficient control for adapting coefficients of the adaptive filter is a second signal derived from the current signal.

2. The mechanical impedance identity circuitry of claim 1, wherein the mechanical impedance identity circuitry implements the coefficient control with a least-mean-squares algorithm.

3. The mechanical impedance identity circuitry of claim 1, wherein the adaptive filter comprises a finite impulse response filter.

4. The mechanical impedance identity circuitry of claim 3 wherein:
   the mechanical impedance identity circuitry applies the adaptive filter to the first signal to generate an adaptive filter output; and
   the coefficient control receives the first signal and a signal derived from the adaptive filter output as its inputs.

5. The mechanical impedance identity circuitry of claim 3 wherein:
   the mechanical impedance identity circuitry is further configured to apply the adaptive filter to the first signal to generate an adaptive filter output;
   the mechanical impedance identity circuitry is further configured to generate an error signal based on the difference between the adaptive filter output and the second signal; and
   the coefficient control receives the first signal and the error signal as its inputs.

6. The mechanical impedance identity circuitry of claim 1, wherein the mechanical impedance identity circuitry generates the first signal by band-pass filtering the back electromotive force signal at frequencies near a resonance frequency of the electromagnetic load.

7. The mechanical impedance identity circuitry of claim 1, wherein the mechanical impedance identity circuitry generates the first signal by filtering the back electromotive force with an integrator filter.

8. The mechanical impedance identity circuitry of claim 1, wherein the mechanical impedance identity circuitry generates the first signal by band-pass filtering the current signal at frequencies near a resonance frequency of the electromagnetic load.

9. The mechanical impedance identity circuitry of claim 1, wherein the mechanical impedance identity circuitry generates the first signal by filtering the back electromotive force with a moving average filter.

10. The mechanical impedance identity circuitry of claim 1, wherein the electromagnetic load comprises a haptic transducer.

11. The mechanical impedance identity circuitry of claim 1, wherein the electromagnetic load comprises a linear resonant actuator.

12. The mechanical impedance identity circuitry of claim 1, wherein the mechanical impedance identity is configured to determine parameters of a mechanical impedance of the electromagnetic load based on coefficients of the adaptive filter.

13. The mechanical impedance identity circuitry of claim 12, wherein the parameters of the mechanical impedance comprise a mechanical resistance of the electromagnetic load at resonance, a resonant frequency of the electromagnetic load, and a quality factor of the electromagnetic load.

14. A method for identifying a mechanical impedance of an electromagnetic load comprising:
   receiving a current signal representative of a current associated with an electromagnetic load during driving of the electromagnetic load by a waveform signal or a signal derived from the waveform signal;
   receiving a back electromotive force signal representative of a back electromotive force associated with the electromagnetic load during driving of the electromagnetic load by a waveform signal or a signal derived from the waveform signal; and implementing an adaptive filter to identify parameters of the mechanical impedance of the electromagnetic load, wherein:
    an input of a coefficient control for adapting coefficients of the adaptive filter is a first signal derived from the back electromotive force signal; and
    a target of the coefficient control for adapting coefficients of the adaptive filter is a second signal derived from the current signal.

15. The method of claim 14, further comprising implementing the coefficient control with a least-mean-squares algorithm.

16. The method of claim 14, wherein the adaptive filter comprises a finite impulse response filter.

17. The method of claim 16, further comprising applying the adaptive filter to the first signal to generate an adaptive filter output, wherein the coefficient control receives the first signal and a signal derived from the adaptive filter output as its inputs.

18. The method of claim 16, further comprising:
    applying the adaptive filter to the first signal to generate an adaptive filter output; and
    generating an error signal based on the difference between the adaptive filter output and the second signal;
    wherein the coefficient control receives the first signal and the error signal as its inputs.

19. The method of claim 14, further comprising generating the first signal by band-pass filtering the back electromotive force signal at frequencies near a resonance frequency of the electromagnetic load.

20. The method of claim 14, further comprising generating the first signal by filtering the back electromotive force with an integrator filter.

21. The method of claim 14, further comprising generating the first signal by band-pass filtering the current signal at frequencies near a resonance frequency of the electromagnetic load.

22. The method of claim 14, further comprising generating the first signal by filtering the back electromotive force with a moving average filter.

23. The method of claim 14, wherein the electromagnetic load comprises a haptic transducer.

24. The method of claim 14, wherein the electromagnetic load comprises a linear resonant actuator.

25. The method of claim 14, further comprising determining parameters of a mechanical impedance of the electromagnetic load based on coefficients of the adaptive filter.

26. The method of claim 25, wherein the parameters of a mechanical impedance comprise the mechanical resistance of the electromagnetic load at resonance, a resonant frequency of the electromagnetic load, and a quality factor of the electromagnetic load.

* * * * *